(12) United States Patent
Klaasen et al.

(10) Patent No.: US 6,573,541 B1
(45) Date of Patent: Jun. 3, 2003

(54) CHARGE COUPLED DEVICE WITH CHANNEL WELL

(75) Inventors: William A. Klaasen, Underhill, VT (US); Gary D. Pittman, Charlotte, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/670,595

(22) Filed: Sep. 29, 2000

(51) Int. Cl.[7] .................. H01L 27/148; H01L 29/768
(52) U.S. Cl. .............. 257/221; 257/223; 257/224; 257/246; 257/248; 257/250
(58) Field of Search .................. 257/221–224, 257/246, 248, 250

(56) References Cited

U.S. PATENT DOCUMENTS

| | | | |
|---|---|---|---|
| 4,211,936 A | 7/1980 | Kosonocky et al. | |
| 4,255,760 A | 3/1981 | Zeitzoff et al. | |
| 4,467,341 A | 8/1984 | Suzuki | |
| 4,485,315 A | 11/1984 | Collet et al. | |
| 4,636,826 A | 1/1987 | Slotboom et al. | |
| 4,677,737 A | 7/1987 | Corrie et al. | |
| 4,724,218 A | 2/1988 | Blanchard et al. | |
| 4,774,719 A | 9/1988 | Pelgrom et al. | |
| 4,779,124 A | 10/1988 | Hynecek | |
| 5,065,203 A | * 11/1991 | Yang et al. | 257/221 |
| 5,388,137 A | 2/1995 | Bosiers et al. | |
| 5,548,142 A | 8/1996 | Arakawa | |

* cited by examiner

Primary Examiner—Gene M. Munson
(74) Attorney, Agent, or Firm—Joseph P. Abate

(57) ABSTRACT

A solid-state CCD device suitable for forming into arrays and for use with suitable hardware to form video image capture devices and methods for fabricating same are provided.

2 Claims, 4 Drawing Sheets

CHARGE COUPLED DEVICE WITH CHANNEL WELL

FIELD OF THE INVENTION

The present invention relates to charge coupled devices (CCD) generally and specifically to channel wells to permit greater charge holding capacity and to permit more rapid movement of charges between gates.

BACKGROUND OF INVENTION

Charge coupled devices are solid state devices that, when formed in arrays and used with suitable imaging hardware, can be used to capture video images.

FIGS. 1, 2A and 2B illustrate a prior art 4 phase charge coupled device structure. FIG. 1 is a top view showing horizontal signal lines running over the channel stop regions and making connections to every fourth gate. Four gates over a channel region comprise a pixel, so the Figure shows three complete pixels. The gates are comprised of overlapping but electrically isolated polysilicon lines running vertically. Holes in the polysilicon lines allow light energy to enter and induce an electron-hole pair when the photon energy exceeds the Si bandgap. Electrical fields cause the electrons to be swept into the channel regions under the gates. Once the image is stored, it is read out much like a shift register is read out. Signals 1–4 force the stored charge to move to the right as two adjacent gates are always turned on together. Holding the voltage high on gates 1 and 2, while keeping the voltage low on gates 3 and 4, creates a potential well under gates 1 and 2 that collects photo-induced charge for the pixel. Changing the voltage on 1 to low and on 3 to high, forces the charge to move from under the 1 and 2 gates to under the 2 and 3 gates. Reversing polarity on the 2 and 4 gates moves the charge under the 3 and 4 gates. The process is repeated until all the original charge in the pixel is now in the new pixel. Of course, any charge in the previous pixel is now in this pixel. This comprises one transfer cycle. The transfer cycles are repeated until all the pixels have been read out, each being moved across the array. Extremely high transfer efficiency is desired because several thousand transfers may be required for the charge to reach the edge of the array.

FIG. 2A is a cross-sectional view through line AA of FIG. 1 showing the overlap of the polysilicon gates along the channel.

FIG. 2B is a cross-sectional view through line BB of FIG. 1 across several channel regions. A peaked P well is present as a vertical antiblooming device. Recess oxidation with P type channel stops acts as isolation between adjacent channel regions. If CCD's are overexposed (the potential wells under the gates cannot hold all the charge), the extra charge will spill over into adjacent pixels. The antiblooming device shown is of the vertical antiblooming type. When collected charge in the channel reaches the well, the excess charge is collected in the substrate.

Dark current is another problem associated with CCD's. Dark current is noise resulting from electrons generated by thermal vibration, by surface states, or in bulk defects. These electrons may collect under the gates, causing white spots and columns in the resulting readout. Dark current is minimized by elimination of all mechanisms, other than light absorption, that are capable of generating electron-hole pairs. Therefore silicon defects, metallic impurities, and surface states must be controlled.

Therefore means are needed to store the excess charge associated with blooming and with Dark current. Means are also needed to more rapidly transfer those charges in a regulated manner.

SUMMARY OF INVENTION

Many applications require differential control of charge propagation in a plurality of CCD channels. A non-exhaustive list is suggestive of some of the applications of the present invention. Networks for parallel to serial, and vice versa, conversion; readout circuits for CCD memories; readout circuits for CCD imagers; decoding and multiplexing networks for CCD channels, CCD imagers; and serial-parallel-serial memory devices. It is understood that the enumerated applications are illustrative of the many uses of the present invention and it is understood that the invention is not limited to those applications.

An aspect of the invention provides a semiconductor field effect device comprising: a silicon substrate having a plurality of channel regions of a first depth wherein each said channel region having first and second portions and wherein each said channel region abuts channel stop; a plurality of first gate oxide regions wherein one of said first gate oxide regions is defined over each of said first portion of each of said channel regions; a plurality of first gate electrodes P1 wherein one of said first gate electrodes is defined over each of said first gate oxide regions; a plurality of second gate oxide regions wherein one of said second gate oxide regions is defined over each of said second gate oxide regions of each of said second portion of each of said channel regions; a plurality of second gate electrodes P3, wherein one of said second gate electrodes is defined over each of said second gate oxide regions, wherein said first and second channel regions abut, and wherein said first and second gate electrodes abut a common insulator; a channel well integral with said channel region and extending part way under each of said first and second gate electrodes, said channel well having a second depth deeper than said first depth; and signal lines running over said channel stop wherein said signal lines make electrical connection to every fourth gate.

A further aspect of the invention is a charge couple device having channel wells in the channel region. The channel wells, located beneath every other overlap of P1 and P3 gates, permit greater charge holding capacity because of the increased volume of the channel itself. Additionally, the presence of the channel well allows for more rapid movement between gates of a greater number of charges by providing a charge sink at just over the transfer point when the gates are switched.

An additional aspect of the invention is a solid-state camera having a photosensitive target and having a semiconductor body having a plurality of charge storage capacities. Herein the photosensitive target is a charge-coupled device.

An aspect of the invention is the use of angled ion implantation to achieve a profile tailored channel well. Angled ion implantation is also an aspect of co-pending applications 0136/00299, 0136/300, and 0136/00301 (numbers reference attorney docket number) assigned to assignee of the present application. However, in the co-pending applications, angled ion implantation achieves other purposes.

Still other objects and advantages of the present invention will become readily apparent by those skilled in the art from the following detailed description, wherein it is shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF A PREFERRED EMBODIMENT

Reference is made to the figures to illustrate selected embodiments and preferred modes of carrying out the invention. It is to be understood that the invention is not hereby limited to those aspects depicted in the figures.

The present invention is described in terms of a silicon substrate. It is to be understood that the present invention is applicable to semiconductor substrates other than silicon including, but not limited to silicon carbide and gallium arsenide. As used herein "metal lines" refers to lines or stripes of metals such as, but not limited to, copper or aluminum, and includes any high conductivity non-metal material such as highly-doped polysilicon or intermetalic silicides having high electrical conductivities associated with metals. Moreover, the terms "poly," "polysilicon," and "polycrystalline silicon" are used interchangeably as is standard in the prior art. Wherein reference is made to impurities of a "first type" it is such reference is understood to encompass impurities of either n or p-type. Following therefrom, reference to impurities of a "second type" refers to impurities of the opposite conductivity type. The terms "gate" and "gate electrode" are used interchangeably.

The present invention introduces a channel well in the channel region as an aid to charge transfer. The channel well is located under every other overlap of P1 and P3 gates. The presence of the well allows more charge to be moved faster between gates by providing a charge sink at just over the transfer point when the gates are switched. It also provides a larger charge holding capacity because of the increased volume of the channel itself.

Figure 1:
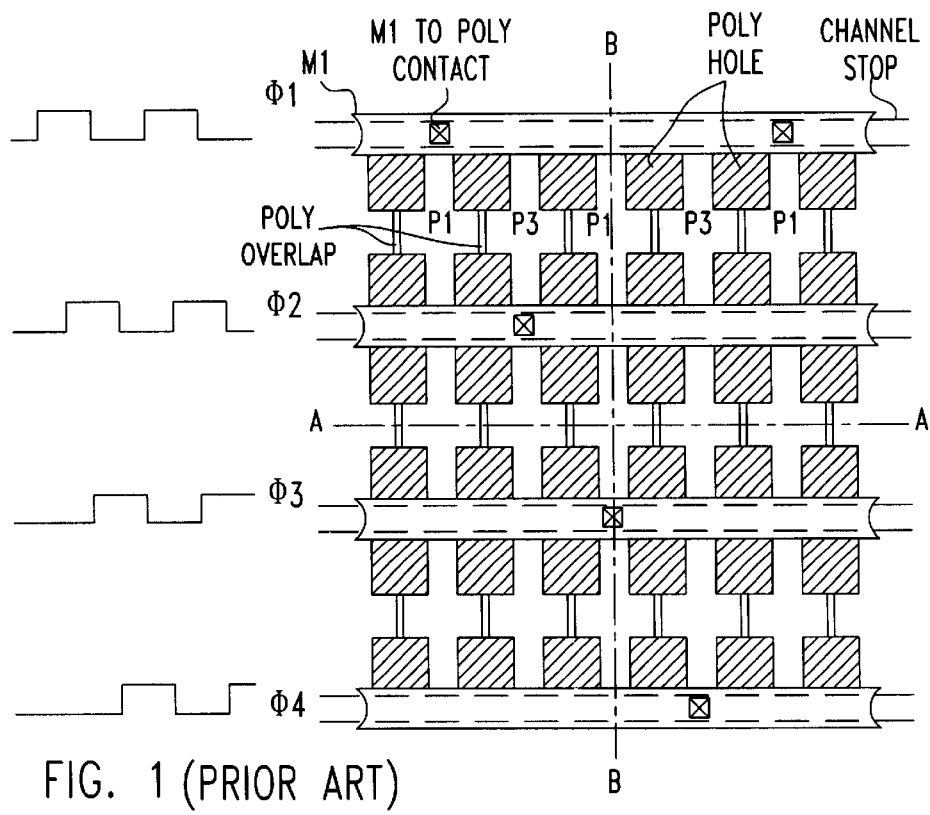
FIG. 1 is a top view of Prior Art 4-phase CCD structure.
Figure 2A:
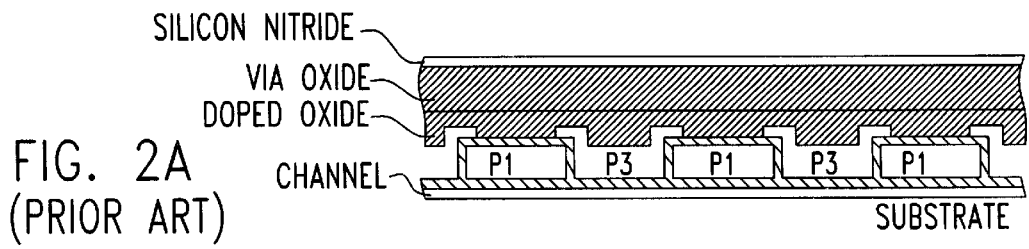
FIG. 2A is a cross-sectional view through line AA of FIG. 1.
Figure 2B:
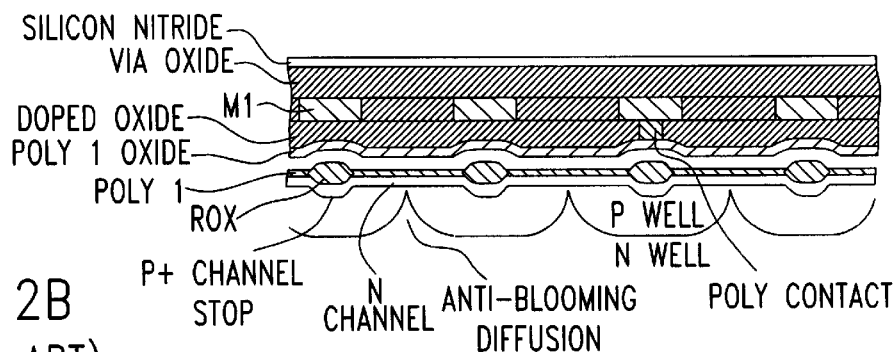
FIG. 2B is a cross-sectional view through line BB of FIG. 1.
Figure 3:
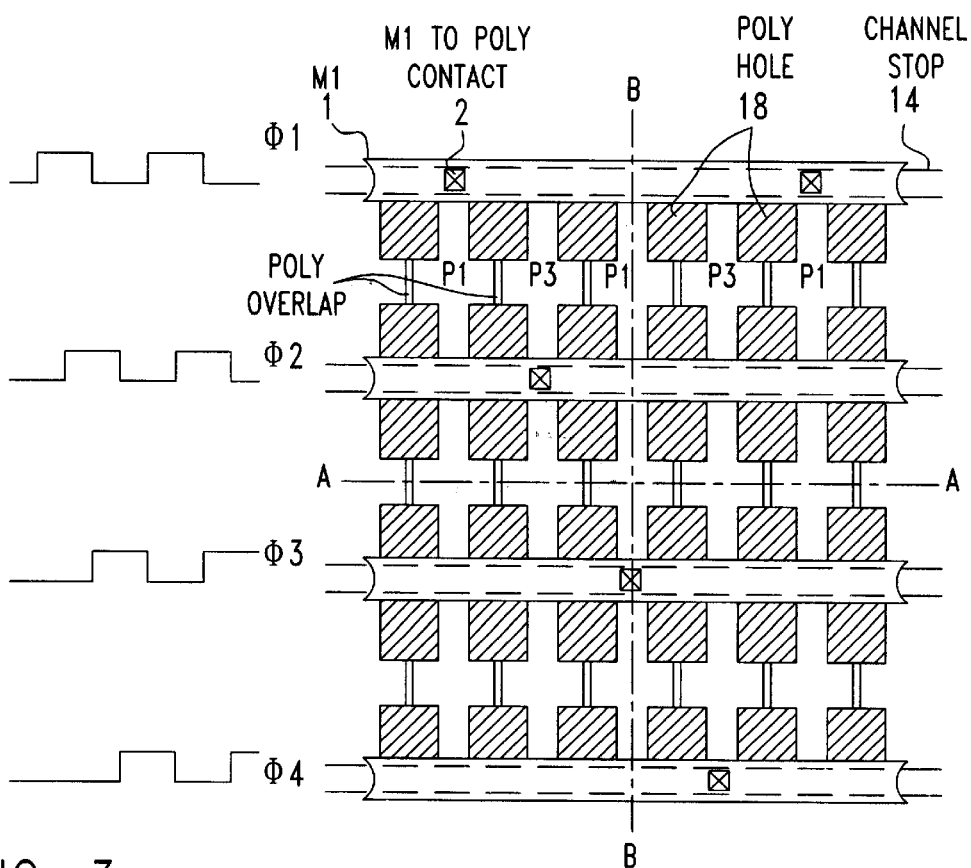
FIG. 3 is a top view of a first embodiment of the CCD of present invention.
Figure 4A:
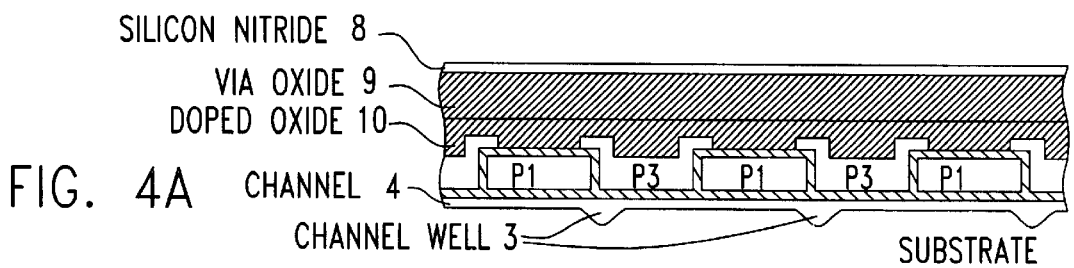
FIG. 4A is a cross-sectional view through line AA of FIG. 3.
Figure 4B:
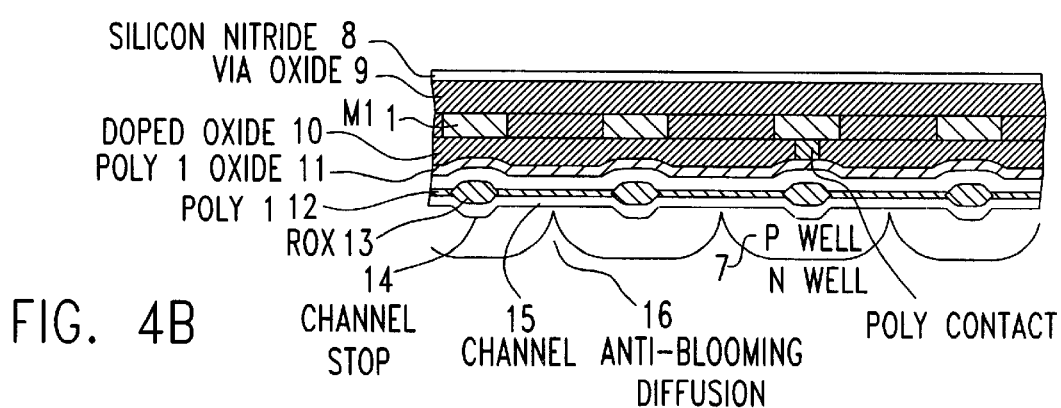
FIG. 4B is a cross-sectional view through line BB of FIG. 3.
Figure 5:
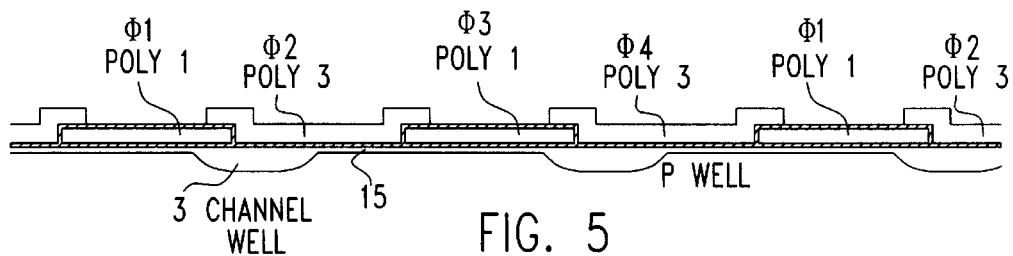
FIG. 5 is an enlargement of section shown in FIG. 4A.

In all of the figures, the various numerals refer to the same structure. FIGS. 3, 4A and 4B and 5 illustrate a first embodiment of the CCD of the present invention in a 4-phase charge coupled device structure. FIG. 3 is a top view showing horizontal signal lines 1 running over the channel stop regions and making connections 2 to every fourth gate. FIG. 4A is a cross-section view through line AA of FIG. 3 showing position of the channel well 3 relative to the channel 4 itself and the P1 and P3 gates. FIG. 4B is a cross-section view through line B of FIG. 3 across several channel regions. A peaked P well 7 is present as an antiblooming device. FIG. 3 also shows the phase signal applied to each gate in a first application of the invention. This is further illustrated in FIG. 5 which is an enlargement of the section shown in FIG. 4A of the gate and channel portions of the CCD. Common features include: layers of silicon nitride 8, via oxide 9, doped oxide 10, poly 1 oxide 11, and poly 1 silicon 12, recessed oxide (ROX) isolation 13, channel stop 14, channel 15, and anti-blooming profile 16.

Figure 6:
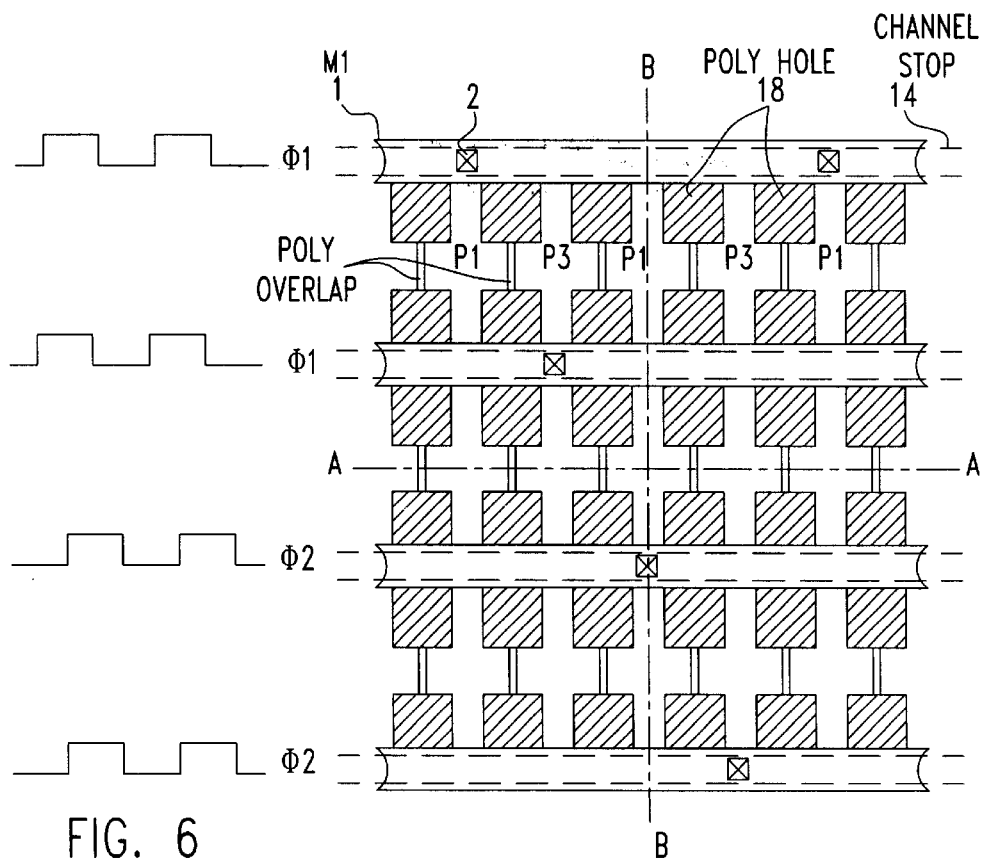
FIG. 6 is a top view of a second embodiment of invention.
Figure 7:
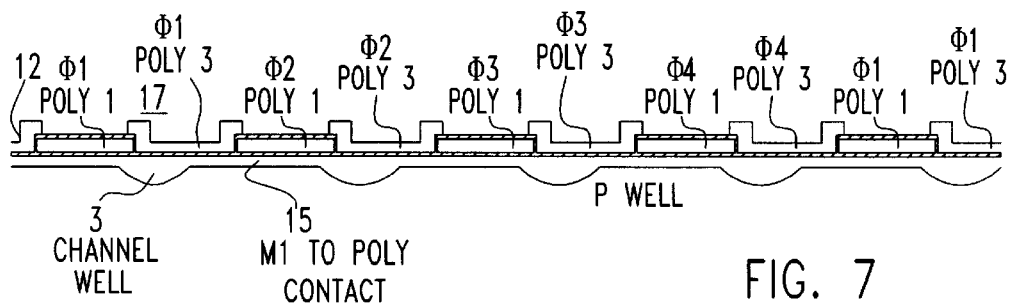
FIG. 7 is a cross-sectional view through line AA of FIG. 6.

FIGS. 6 and 7 illustrate a second embodiment of the invention. FIG. 6 is a top view showing horizontal signal lines 1 running over the channel stop regions 14 and making connections to every fourth gate 2. However the phase signals are applied to adjacent pairs of P1/P3 gates. Also indicated are holes 18 in the polysilicon lines to allow light energy to enter and generate charges which become trapped in the channel regions under the gates. FIG. 7 is a cross-section view of the gate and channel portions of the CDD through line AA of FIG. 6 showing position of the channel well 3 relative to the channel 15 itself and the P1 12 and P3 17 gates. In this embodiment the channel well primarily provides increased charge storage and is primarily an antiblooming device. Also note that the dimensions of the gates are half those in the first embodiment in order to keep the total number of pixels the same in both embodiments, but this is not a requirement.

Figure 8A:
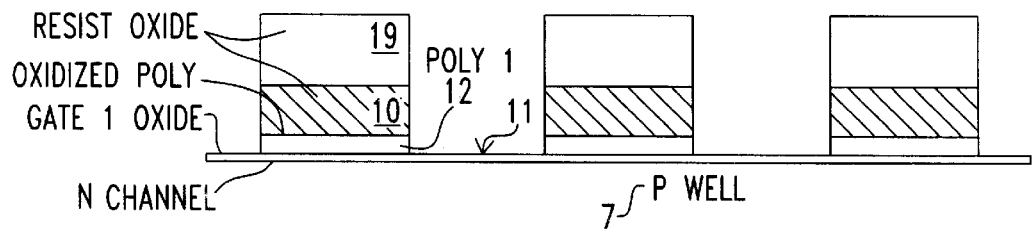
FIG. 8A is an illustration of a fabrication method.
Figure 8B:
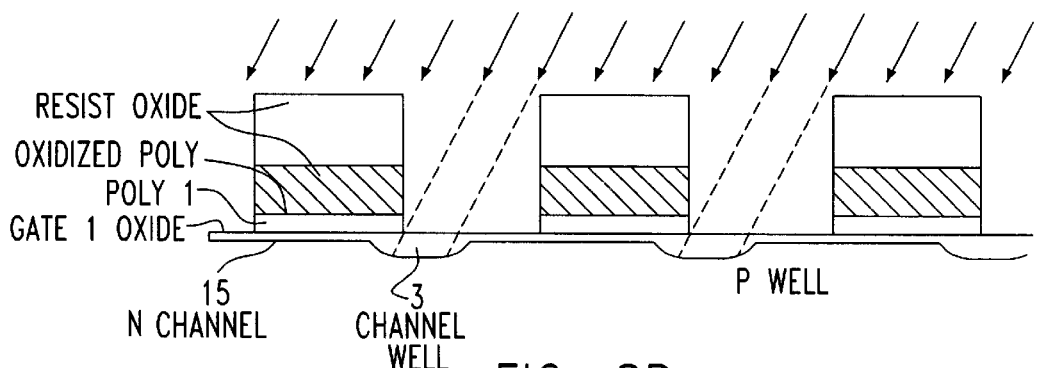
FIG. 8B is an illustration of a fabrication method.
Figure 8C:
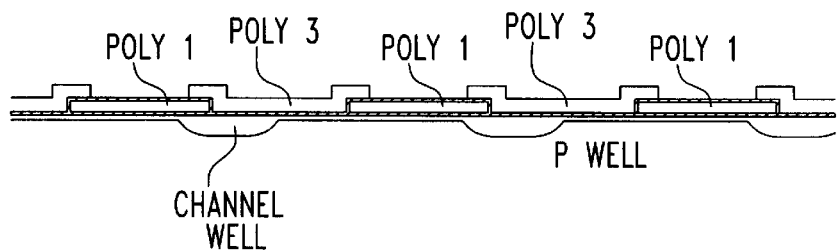
FIG. 8C is an illustration of a fabrication method.

FIGS. 8A through 8C illustrate a fabrication method. The first embodiment is used as an example for dimensions. A stack of P1 gate oxide 11, P1 polysilicon 12, deposited thick (BPSG) oxide 10, and photoresist 19 would be formed on a substrate already having N well, P well, channel stop, and channel structures formed. The resist would be patterned and the thick oxide and polysilicon etched as shown in FIG. 8A. For a P1 3 micrometer width and space the stack should be 3 micrometer high. The individual layer thickness in the stack may be 0.25 micrometer of polysilicon, 1.0 micrometer of oxide, and 1.75 micrometer of resist. A 30° angled implant from the "P3" side is then performed. This will produce an channel well of about 1.5 micrometer wide, with a 0.5 micrometer first tail under PI and a 0.5 micrometer body and 0.5 micrometer second tail under P3. The preferred dopant ion is phosphorous and the preferred concentration is $5 \times 10^{15}$ atoms/cm$^3$. The preferred combination of dose, implantation angle, and implantation energy yields a linear, lateral concentration gradient from the edge of P1 extending under P3. The resist and oxide is removed, a gate 3 oxidation performed, and P3 polysilicon deposited and patterned as shown in FIG. 8C to complete the pertinent fabrication steps. The remaining steps required to complete the CDD being well understood.

It will, therefore, be appreciated by those skilled in the art having the benefit of this disclosure that this invention is a charge couple device having channel well in the channel region. Moreover, those same skilled artisans will comprehend that the invention permits greater charge storage capacity as well while permitting more rapid charge transfer. Furthermore, it is to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense. Moreover, it is intended that the appended claims be construed to include alternative embodiments.

What is claimed is:

1. A semiconductor field effect device comprising:

a silicon substrate having a plurality of channel regions of a first depth wherein each said channel region having first and second portions and wherein each said channel region abuts a channel stop;

a plurality of first gate oxide regions wherein one of said first gate oxide regions is defined over each of said first portion of each of said channel regions;

a plurality of first gate electrodes wherein one of said first gate electrodes is defined over each of said first gate oxide regions;

a plurality of second gate oxide regions wherein one of said second gate oxide regions is defined over each of said second regions of each of said second portion of each of said channel regions;

a plurality of second gate electrodes wherein one of said second gate electrodes is defined over each of said second gate oxide regions, wherein said first and second channel regions abut, and wherein said first and second gate electrodes abut a common insulator;

a channel well integral with said channel region and extending part way under each of said first and second gate electrodes, said channel well having a second depth deeper than said first depth; and signal lines running over said channel stops wherein said signal lines make electrical connection to every fourth gate electrode.

2. A semiconductor field effect device, according to claim 1, comprising a peaked P well.

* * * * *